US012165908B2

(12) United States Patent
Mori

(10) Patent No.: US 12,165,908 B2
(45) Date of Patent: Dec. 10, 2024

(54) VACUUM PROCESSING APPARATUS AND METHOD OF CONTROLLING VACUUM PROCESSING APPARATUS

(71) Applicant: Tokyo Electron Limited, Tokyo (JP)

(72) Inventor: Kiyoshi Mori, Fuchu (JP)

(73) Assignee: Tokyo Electron Limited, Tokyo (JP)

(*) Notice: Subject to any disclaimer, the term of this patent is extended or adjusted under 35 U.S.C. 154(b) by 685 days.

(21) Appl. No.: 17/304,973

(22) Filed: Jun. 29, 2021

(65) Prior Publication Data
US 2022/0009111 A1  Jan. 13, 2022

(30) Foreign Application Priority Data

Jul. 7, 2020 (JP) .................................. 2020-116868

(51) Int. Cl.
*H01L 21/687* (2006.01)
*B25J 21/00* (2006.01)
*H01L 21/677* (2006.01)

(52) U.S. Cl.
CPC ........ *H01L 21/68785* (2013.01); *B25J 21/00* (2013.01); *H01L 21/6776* (2013.01); *H01L 21/68742* (2013.01); *H01L 21/68764* (2013.01)

(58) Field of Classification Search
CPC ...... G05B 2219/45031; H01L 21/6776; H01L 21/67796; H01L 21/68764; H01L 21/68785

See application file for complete search history.

(56) References Cited

U.S. PATENT DOCUMENTS

2018/0096874 A1   4/2018  Schaller et al.
2019/0360633 A1*  11/2019  Schaller ............ H01L 21/68742

FOREIGN PATENT DOCUMENTS

| JP | 2001-230307 A | 8/2001 |
| JP | 2004-214316 A | 7/2004 |
| JP | 2005-286211 A | 10/2005 |
| JP | 2013-023710 A | 2/2013 |
| KR | 10-0738877 B1 | 7/2007 |
| KR | 10-2019-0097447 A | 8/2019 |

* cited by examiner

*Primary Examiner* — Tyrone V Hall, Jr.
(74) *Attorney, Agent, or Firm* — Armstrong Teasdale LLP

(57) ABSTRACT

The present disclosure reduces deviation in the position and inclination of a stage due to the deformation of a processing container. A vacuum processing apparatus includes a processing container configured to be capable of maintaining an inside thereof in a vacuum atmosphere, a stage provided in the processing container such that a substrate is placed thereon, a support member passing through a hole in the bottom of the processing container to support the stage from the bottom side, a base member engaged with an end portion of the support member located outside the processing container to be movable integrally with the stage, and a plurality of actuators provided in parallel with each other between the bottom of the processing container and the base member and configured to adjust a position and an inclination of the stage by moving the base member relative to the bottom of the processing container.

14 Claims, 10 Drawing Sheets

VACUUM PROCESSING APPARATUS AND METHOD OF CONTROLLING VACUUM PROCESSING APPARATUS

CROSS-REFERENCE TO RELATED APPLICATION

This application is based upon and claims the benefit of priority from Japanese Patent Application No. 2020-116868, filed on Jul. 7, 2020, the entire contents of which are incorporated herein by reference.

TECHNICAL FIELD

The present disclosure relates to a vacuum processing apparatus and a method of controlling the vacuum processing apparatus.

BACKGROUND

Patent Document 1 discloses a structure in which an adjustment plate configured to adjust the inclination of a stage on which a substrate is placed is disposed below the bottom of a processing container, and the bottom of the processing container and the adjustment plate are fastened with bolts.

PRIOR ART DOCUMENT

Patent Document

Patent Document 1: Japanese Laid-Open Patent Publication No. 2001-230307

SUMMARY

According to one embodiment of the present disclosure, there is provided a vacuum processing apparatus including: a processing container configured to be capable of maintaining an inside of the processing container in a vacuum atmosphere; a stage provided in the processing container and having a substrate placed on the stage; a support member passing through a hole in a bottom of the processing container to support the stage from a bottom side of the stage; a base member engaged with an end portion of the support member located outside the processing container to be movable integrally with the stage; and a plurality of actuators provided in parallel with each other between the bottom of the processing container and the base member, and configured to adjust a position and an inclination of the stage by moving the base member relative to the bottom of the processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a vacuum processing apparatus and a method of controlling the vacuum processing apparatus disclosed herein will be described in detail with reference to the drawings. The vacuum processing apparatus and method of controlling the same disclosed herein are not limited by the following embodiments.

A processing container of a vacuum processing apparatus is deformed due to a pressure difference when the internal pressure thereof is switched from an atmospheric state to a vacuum state. The processing container is also deformed due to a temperature change. When the processing container is deformed, the stress due to the deformation of the processing container is transmitted to the stage, and the position and inclination of the stage may deviate from the desired position and inclination. For example, in the structure in which an adjustment plate is arranged below the bottom of the processing container as in Patent Document 1, the adjustment plate is moved using a bolt to reduce deviation in the inclination of the stage due to the deformation of the processing container. However, it is difficult to reduce or eliminate the deviation in the position of the stage. Therefore, there is a need for a technique for reducing or eliminating the deviation in the position and inclination of a stage due to the deformation of a processing container.

Embodiments

[Configuration of Vacuum Processing System]

Figure 1:
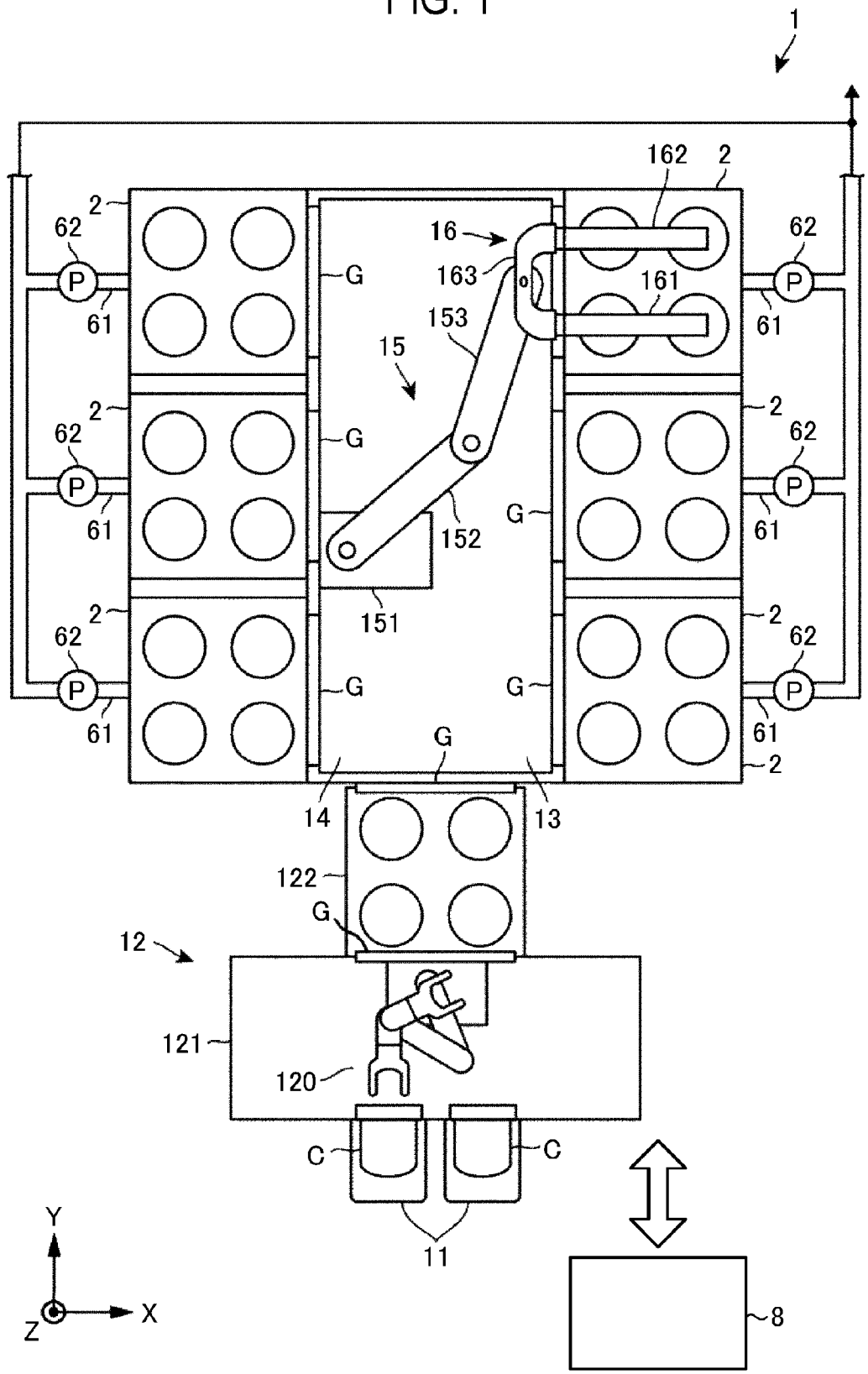
FIG. 1 is a schematic plan view illustrating an exemplary configuration of a vacuum processing system according to an embodiment.

FIG. 1 is a schematic plan view illustrating an exemplary configuration of a vacuum processing system according to an embodiment. A vacuum processing system 1 includes a carry-in/out port 11, a carry-in/out module 12, a vacuum transport module 13, and a vacuum processing apparatus 2. In FIG. 1, the X direction will be referred to as a left-right direction, the Y direction will be referred to as a front-rear direction, the Z direction will be referred to as an up-down direction (height direction), and the side having the carry-in/out port 11 therein will be referred to as a front side in the front-rear direction. The carry-in/out port 11 is connected to the front side of the carry-in/out module 12, and the vacuum transport module 13 is connected to the rear side of the carry-in/out module 12 in the front-rear direction.

A carrier C, which is a transport container accommodating substrates to be processed, is placed in the carry-in/out port 11. The substrate is a wafer W, which is a circular substrate having a diameter of, for example, 300 mm. The carry-in/out module 12 is a module configured to perform carry-in/out of a wafer W between the carrier C and the vacuum transport module 13. The carry-in/out module 12 includes a normal-pressure transport chamber 121 configured to transport a wafer W to and from the carrier C in a normal-pressure atmosphere by a transport mechanism 120, and a load-lock chamber 122 configured to switch the atmosphere in which a wafer W is placed between a normal-pressure atmosphere and a vacuum atmosphere.

The vacuum transport module 13 has a vacuum transport chamber 14 in which a vacuum atmosphere is formed. A substrate transport mechanism 15 is arranged inside the vacuum transport chamber 14. The vacuum transport chamber 14 is formed in, for example, a rectangular shape having long sides in the front-rear direction in a plan view. Among the four side walls of the vacuum transport chamber 14, a plurality of (for example, three) vacuum processing apparatuses 2 are connected to each of the opposite long sides of the rectangle. In addition, among the four side walls of the vacuum transport chamber 14, the load-lock chamber 122 installed in the carry-in/out module 12 is connected to the short side on the front side. Gate valves G are arranged between the normal-pressure transport chamber 121 and the load-lock chamber 122, between the load-lock chamber 122 and the vacuum transport module 13, and between the vacuum transport module 13 and each of the vacuum processing apparatuses 2, respectively. Each gate valve G opens and closes the carry-in/out port of the wafer W provided in a corresponding one of the modules connected to each other.

The substrate transport mechanism 15 transports a wafer W between the carry-in/out module 12 and each of the vacuum processing apparatuses 2 in a vacuum atmosphere. The substrate transport mechanism 15 is configured as an articulated arm, and includes a substrate holder 16 configured to hold a wafer W. Each vacuum processing apparatus 2 collectively processes a plurality of (e.g., four) wafers W in a vacuum atmosphere using a processing gas. Therefore, the substrate holder 16 of the substrate transport mechanism 15 is configured to hold, for example, four wafers W such that the four wafers W are delivered together to the vacuum processing apparatuses 2, respectively.

Specifically, the substrate transport mechanism 15 includes, for example, a base 151, a horizontally extending first arm 152, a horizontally extending second arm 153, and a substrate holder 16. The base side of the first arm 152 is provided on the base 151 and swivels around a vertical swivel axis on the base 151. The base side of the second arm 153 is provided on the tip of the first arm 152, and the second arm 153 swivels around a vertical swivel axis on the tip of the first arm 152. The substrate holder 16 has a first substrate holder 161, a second substrate holder 162, and a connecting part 163. The first substrate holder 161 and the second substrate holder 162 are configured in the shape of two elongated spatulas extending horizontally and parallel to each other. The connecting part 163 extends horizontally so as to be orthogonal to the direction of extension of the first and second substrate holders 161 and 162, and connects the base ends of the first and second substrate holders 161 and 162 to each other. The central portion of the connecting part 163 in the length direction is provided on the tip of the second arm 153 and swivels around a vertical swivel axis on the tip of the second arm 153. The first substrate holder 161 and the second substrate holder 162 will be described later.

The vacuum processing system 1 has a controller 8. The controller 8 is, for example, a computer including a processor, a storage, an input device, a display device, and the like. The controller 8 controls each part of the vacuum processing system 1. With the controller 8, an operator may perform a command input operation or the like using the input device in order to manage the vacuum processing system 1. In addition, in the controller 8, the operating state of the vacuum processing system 1 may be visualized and displayed by the display device. In addition, the storage of the controller 8 stores a control program, recipe data, and the like for use by the processor in controlling various processes executed by the vacuum processing apparatus 1. The processor of the controller 8 executes the control program and controls each part of the vacuum processing system 1 according to the recipe data, whereby desired substrate processing is executed in the vacuum processing system 1.

[Configuration of Vacuum Processing Apparatus]

Figure 2:
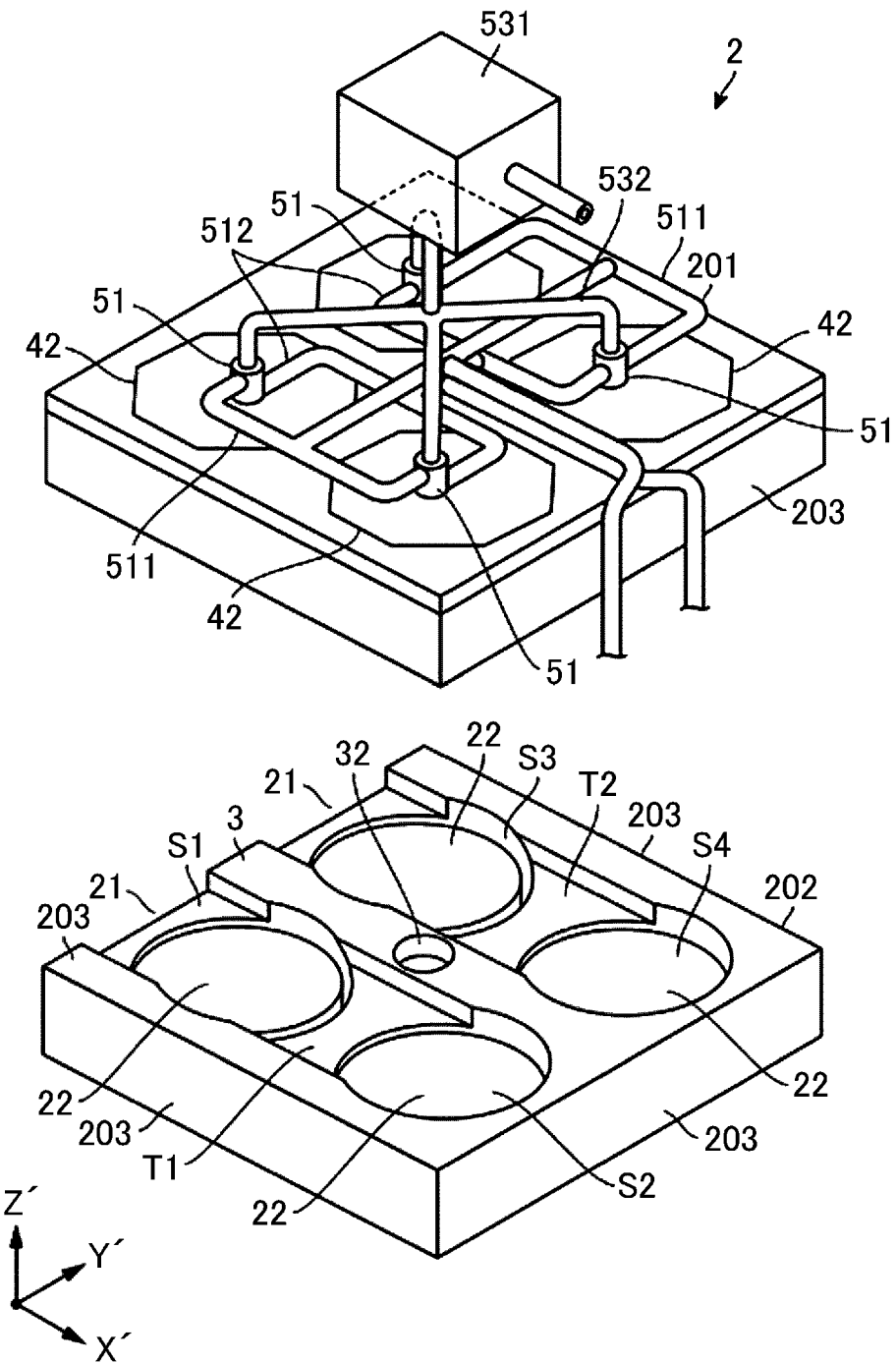
FIG. 2 is an exploded perspective view illustrating an exemplary configuration of a vacuum processing apparatus according to an embodiment.
Figure 3:
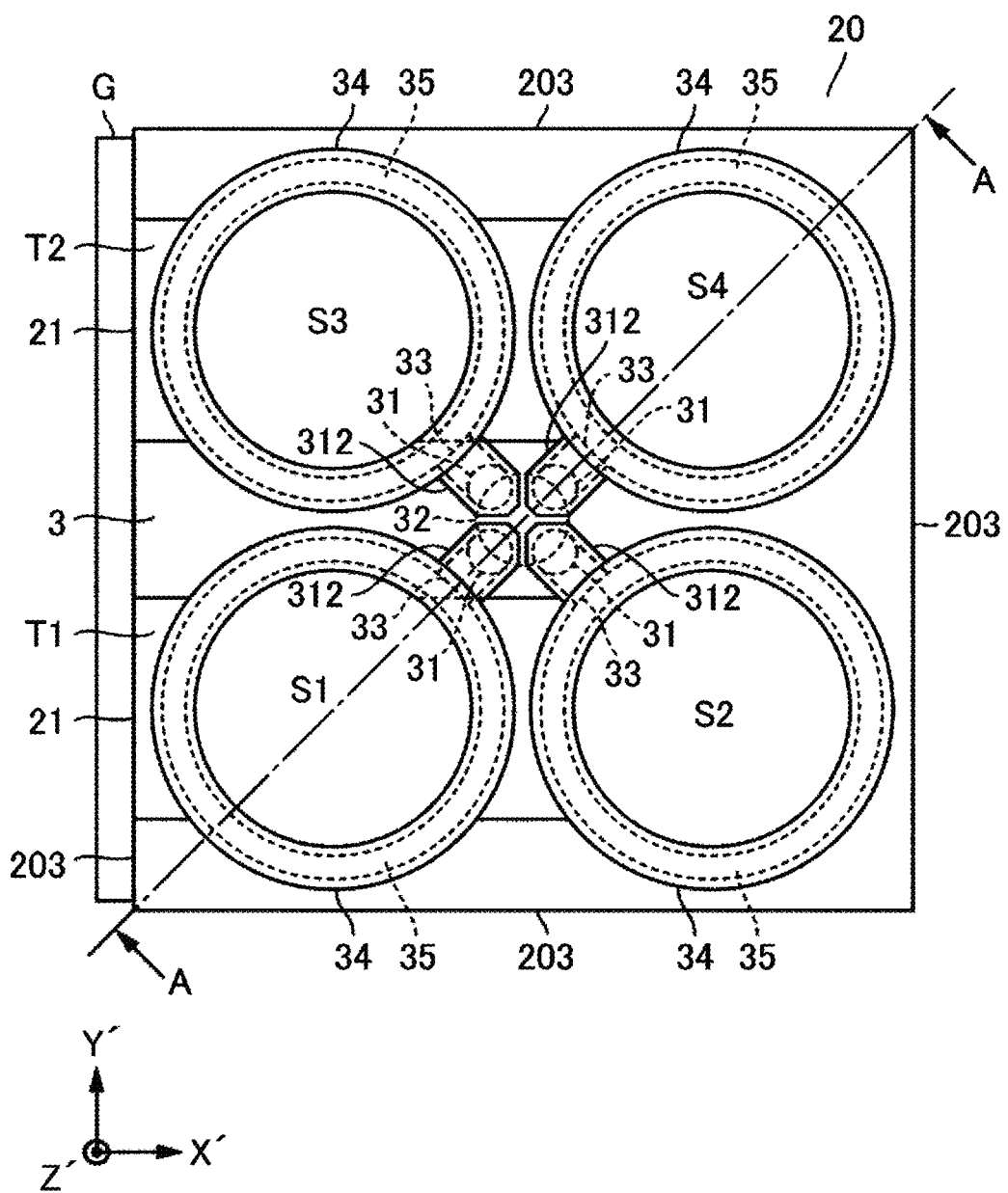
FIG. 3 is a plan view schematically illustrating an internal configuration of a vacuum processing apparatus according to an embodiment.

Next, an example in which the vacuum processing apparatus 2 is applied to, for example, a film forming apparatus that performs plasma chemical vapor deposition (CVD) processing on, for example, wafers W will be described with reference to FIGS. 2 to 4. FIG. 2 is an exploded perspective view illustrating an exemplary configuration of a vacuum processing apparatus 2 according to an embodiment. FIG. 3 is a plan view schematically illustrating an internal configuration of the vacuum processing apparatus 2 according to the embodiment.

The six vacuum processing apparatuses 2 are configured in the same manner as each other, and the vacuum processing apparatuses 2 are capable of processing wafers W in parallel with each other. Each vacuum processing apparatus 2 includes a processing container (a vacuum container) 20 having a rectangular shape in a plan view. The processing container 20 is configured to maintain the inside thereof in a vacuum atmosphere. The processing container 20 is configured by providing concave open portions in the top surface of a container body 202 and covering the open portions with a ceiling member 201. The processing container 20 has, for example, side wall portions 203 surrounding the periphery thereof. Among the four side wall portions 203, the side wall portion 203 connected to the vacuum transport chamber 14 includes two carry-in/out ports 21 formed to be arranged in the front-rear direction (the Y' direction in FIG. 2). The carry-in/out ports 21 are opened and closed by a gate valve G.

As illustrated in FIGS. 2 and 3, inside the processing container 20, a first transport space T1 and a second transport space T2 extending in the horizontal direction from respective carry-in/out ports 21 are provided at positions adjacent to each other so as to transport wafers W therein. In addition, an intermediate wall portion 3 is provided between the first transport space T1 and the second transport space T2 in the processing container 20 along the direction of extension of the same (the X' direction in FIG. 2). Two processing spaces S1 and S2 are arranged in the first transport space T1 along the direction of extension of the same, and two processing spaces S3 and S4 are arranged in the second transport space T2 along the direction of extension thereof. Therefore, in the processing container 20, a total of four processing spaces S1 to S4 are arranged in a 2×2 matrix when viewed from the top side. The horizontal direction referred to herein also includes the case in which wafers W are slightly tilted in the extension direction in a range where there is no influence such as contact between devices during a carry-in/out operation of the wafers W due to the influence of tolerance at the time of manufacturing.

Figure 4:
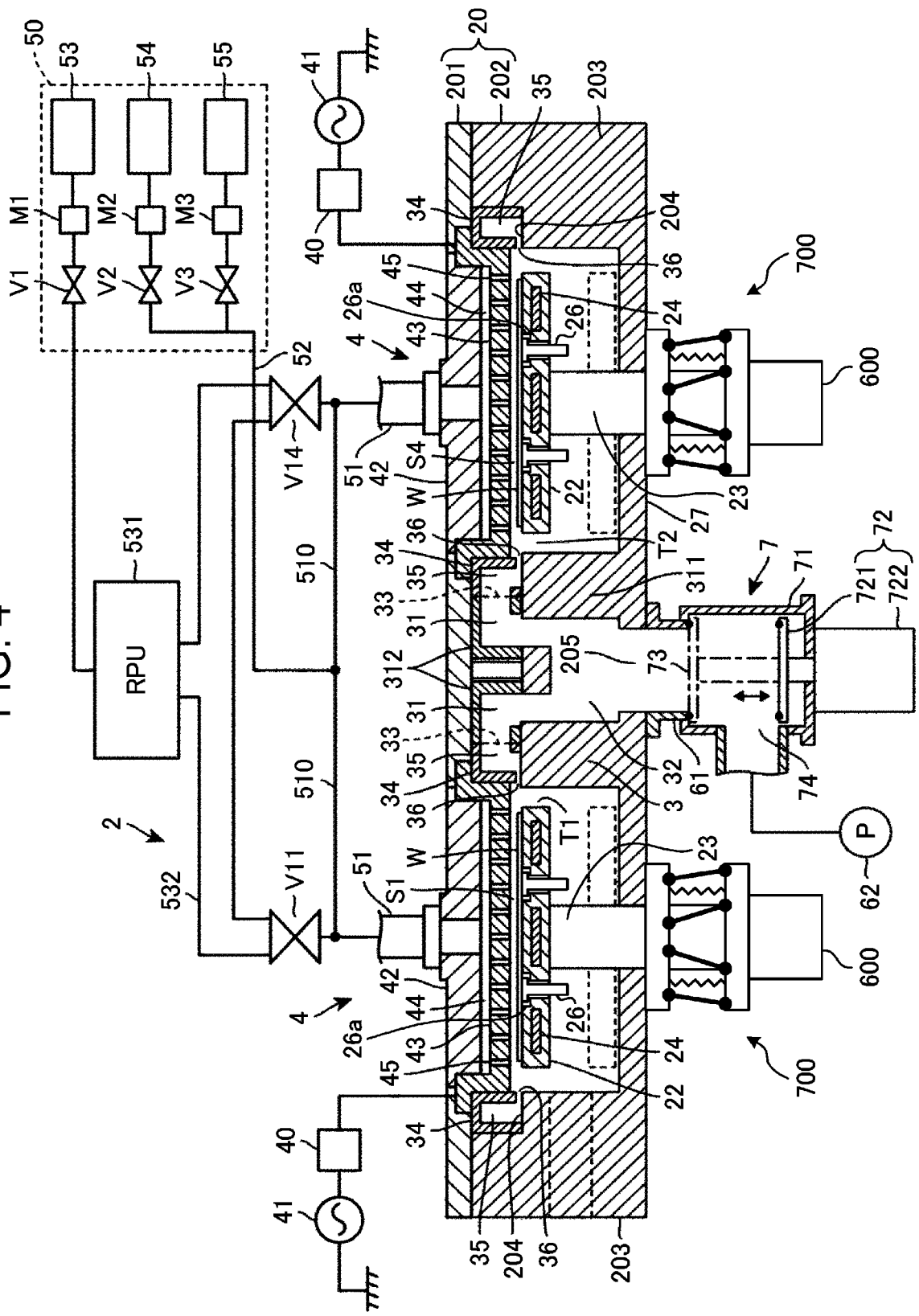
FIG. 4 is a schematic cross-sectional view illustrating an exemplary configuration of a vacuum processing apparatus according to an embodiment.

FIG. 4 is a schematic cross-sectional view illustrating an exemplary configuration of a vacuum processing apparatus 2 according to an embodiment. The cross section of FIG. 4 corresponds to the cross section of the vacuum processing apparatus 2 taken along the line A-A in FIG. 3. The four processing spaces S1 to S4 are configured in the same manner as each other, and are formed between stages 22, on each of which a wafer W is placed, and gas supply parts 4 are arranged so as to face respective ones of the stages 22. In other words, in the processing container 20, a stage 22 and a gas supply part 4 are provided for each of the four processing spaces S1 to S4. FIG. 4 illustrates a processing space S1 of the first transport space T1 and a processing space S4 of the second transport space T2. Hereinafter, the processing space S1 will be described as an example.

Each stage 22 also serves as a lower electrode, is made of, for example, a metal or aluminum nitride (AlN), in which a metal mesh electrode is embedded, and has a flat columnar shape. The stage 22 is supported by a support member 23 from the bottom side. The support member 23 is formed in a cylindrical shape, extends vertically downwards, and penetrates the bottom 27 of the processing container 20. The lower end of the support member 23 is located outside the processing container 20, and is connected to a rotational driving mechanism 600. The support member 23 is rotated by the rotational driving mechanism 600. The stage 22 is configured to be rotatable according to the rotation of the support member 23. An adjustment mechanism 700 is provided at the lower end of the support member 23 to adjust the position and inclination of the stage 22. The stage 22 is configured to be capable of being raised and lowered between a processing position and a delivery position using the support member 23 by the adjustment mechanism 700. In FIG. 4, the stage 22 located at the processing position is drawn with a solid line, and the stage 22 located at the delivery position is drawn with a broken line. The processing position is the position when substrate processing (e.g., film forming processing) is executed, and the delivery position is the position at which a wafer W is transported to and from a substrate transport mechanism 15. The rotational driving mechanism 600 and the adjustment mechanism 700 will be described later.

A heater 24 is embedded in the stage 22. The heater 24 heats each wafer W placed on the stage 22 to, for example, about 60 degrees C. to 600 degrees C. In addition, the stage 22 is connected to a ground potential.

In addition, the stage 22 is provided with a plurality of (e.g., three) pin through holes 26a, and lifter pins 26 are arranged inside these pin through holes 26a, respectively.

The pin through holes 26a are provided so as to penetrate from the placement surface (top surface) of the stage 22 to the rear surface (bottom surface) with respect to the placement surface. The lifter pins 26 are slidably inserted into the pin through holes 26a. The upper ends of the lifter pins 26 are suspended at the placement surface sides of the pin through holes 26a. That is, the upper ends of the lifter pins 26 have a diameter larger than that of the pin through holes 26a, and recesses having a diameter and a thickness larger than those of the upper ends of the lifter pins 26 are formed in the upper ends of the pin through holes 26a to be capable of accommodating the upper ends of the lifter pins 26, respectively. As a result, the upper ends of the lifter pins 26 are engaged with the stage 22 and suspended from the placement surface sides of the pin through holes 26a, respectively. In addition, the lower ends of the lifter pins 26 protrude from the rear surface of the stage 22 toward the bottom 27 side of the processing container 20.

As illustrated in FIG. 4, in the state in which the stage 22 is raised to the processing position, the upper ends of the lifter pins 26 are received in the recesses at the placement sides of the pin through holes 26a, respectively. From this state, when the stage 22 is lowered to the delivery position and the lifter pins 26 are raised by a lifting mechanism (not shown), the upper ends of the lifter pins 26 protrude from the placement surface of the stage 22.

Here, the first and second substrate holders 161 and 162 will be described. The first substrate holder 161 is configured to support wafers W at positions corresponding to respective arrangement positions of the processing spaces S1 and S2 in the first transport space T1 when the first substrate holder 161 enters the first transport space T1. The positions corresponding to respective arrangement positions of the processing spaces S1 and S2 in the first transport space T1 are the positions set to deliver wafers W to the two stages 22 provided in the processing spaces S1 and S2 of the first transport space T1. In addition, the second substrate holder 162 is configured to support wafers W at positions corresponding to respective arrangement positions of the processing spaces S3 and S4 in the second transport space T2 when the second substrate holder 162 enters the second transport space T2. The positions corresponding to respective arrangement positions of the processing spaces S3 and S4 in the second transport space T2 are the positions set to deliver wafers W to the two stages 22 provided in the processing spaces S3 and S4 of the second transport space T2.

For example, the width of each of the first and second substrate holders 161 and 162 is smaller than the diameter of the wafers W, and the rear surfaces of the wafers W are supported at an interval from each other on the tip side and the base end side of each of the first and second substrate holders 161 and 162. The wafers W supported on the tip sides of the first and second substrate holders 161 and 162 are supported on the tips of the first and second substrate holders 161 and 162 at, for example, the centers thereof.

In this way, by the cooperative action of the substrate transport mechanism 15, the lifter pins 26, and the stage 22, for example, the delivery of four wafers W between the substrate transport mechanism 15 and each stage 22 is collectively and concurrently performed.

The gas supply part 4 is provided above each stage 22 in the ceiling member 201 of the processing container 20 via a guide member 34 made of an insulating member. The gas supply part 4 has a function as an upper electrode. The gas supply part 4 includes a cover 42, a shower plate 43 forming a facing surface provided to face the placement surface of the stage 22, and a gas flow chamber 44 formed between the cover 42 and the shower plate 43. A gas supply pipe 51 is connected to the cover 42, and gas ejection holes 45 penetrating the shower plate 43 in the thickness direction are arranged vertically and horizontally in the shower plate 43 such that gas is ejected toward the stage 22 in a shower form.

Each gas supply part 4 is connected to a gas supply system 50 via a gas supply pipe 51. The gas supply system 50 includes, for example, supply sources of a reaction gas (a film forming gas), a purge gas, or a cleaning gas, which are processing gases, a pipe, a valve V, a flow control part M, and the like.

A radio frequency power supply 41 is connected to the shower plate 43 via a matcher 40. The shower plate 43 has a function as an upper electrode facing the stage 22. When radio frequency power is applied between the shower plate 43, which is the upper electrode, and the stage 22, which is the lower electrode, it is possible to plasmatize a gas supplied from the shower plate 43 to the processing space S1 (a reaction gas in this example) through capacitive coupling.

Next, an exhaust path and a confluent exhaust path formed in an intermediate wall portion 3 will be described. As illustrated in FIGS. 3 and 4, the intermediate wall portion 3 includes exhaust paths 31 provided for the four processing spaces S1 to S4, respectively, and a confluent exhaust path 32 at which these exhaust paths 31 merge. The confluent exhaust path 32 extends in the up-and-down direction in the intermediate wall portion 3. The intermediate wall portion 3 includes a wall body 311 provided on the container body 202 side and an exhaust path forming member 312 provided on the side of the ceiling member 201. The exhaust paths 31 are provided inside the exhaust path forming member 312.

In addition, on the wall surface of the intermediate wall portion 3 located outside each of the processing spaces S1 to S4, an exhaust port 33 is formed for each of the processing spaces S1 to S4. Each exhaust path 31 is formed in the intermediate wall portion 3 so as to connect the exhaust port 33 and the confluent exhaust path 32 to each other. Each exhaust path 31 extends, for example, in the horizontal direction in the intermediate wall portion 3, and is then bent downwards and extends in the up-and-down direction to be connected to the confluent exhaust path 32. For example, the exhaust path 31 has a circular cross section (see FIG. 3), the downstream end of each exhaust path 31 is connected to the upstream end of the confluent exhaust path 32, and the upstream side of each exhaust path 31 is open to the outside of each of the processing spaces S1 to S4, thereby serving as an exhaust port 33.

Around each of the processing spaces S1 to S4, a guide member 34 for exhaust is provided so as to surround each of the processing spaces S1 to S4. The guide member 34 is, for example, an annular body provided so as to surround the area around the stage 22 at the processing position at an interval spaced apart from the stage 22. The guide member 34 is configured to form therein a flow path 35 having, for example, a rectangular shape in vertical cross-sectional view and annular shape in a plan view. FIG. 3 schematically illustrates the processing spaces S1 to S4, the guide members 34, the exhaust paths 31, and the confluent exhaust path 32.

As illustrated in FIG. 4, each guide member 34 has, for example, a U shape in the vertical cross section, and is arranged such that the opening portion of the U shape is directed downwards. The guide members 34 are fitted into respective recesses 204 formed in the intermediate wall portion 3 and closer to the side wall portions 203 of the container body 202, and form flow paths 35 between the intermediate wall portion 3 and the members constituting the side wall portions 203.

The guide members 34 fitted into the respective recesses 204 form slit-shaped slit exhaust ports 36 that are open toward respective processing spaces S1 to S4. In this way, a slit exhaust port 36 is formed in the side peripheral portion of each of the processing spaces S1 to S4 along the circumferential direction. An exhaust port 33 is connected to each of the flow paths 35, and the processing gas exhausted from the slit exhaust ports 36 is allowed to flow toward the exhaust port 33.

Attention is now to be paid to a set of two processing spaces S1 and S2 arranged along the extension direction of the first transport space T1 and a set of two processing spaces S3 and S4 arranged along the extension direction of the second transport space T2. As illustrated in FIG. 3, the sets of processing spaces S1 and S2 and spaces S3 and S4 are arranged rotationally symmetrically by 180 degrees around the confluent exhaust path 32 when viewed from the side of the top surface.

As a result, the flow paths for a processing gas extending from respective processing spaces S1 to S4 to the confluent exhaust path 32 via the slit exhaust ports 36, the flow paths 35 in the guide members 34, the exhaust ports 33, and the exhaust paths 31 surround the confluent exhaust path 32, and are formed rotationally symmetrically by 180 degrees around the confluent exhaust path 32. Paying attention only to the flow paths, excluding the positional relationships with the first and second transport spaces T1 and T2 and the intermediate wall portion 3, these flow paths may be said to be formed rotationally symmetrically by 90 degrees around the confluence exhaust path 32.

The confluent exhaust path 32 is connected to exhaust pipes 61 via a confluent exhaust port 205 formed in the bottom 27 of the processing container 20. Each exhaust pipe 61 is connected to a vacuum pump 62 forming a vacuum exhaust mechanism via a valve mechanism 7. For example, one vacuum pump 62 is provided in one processing container 20 (see FIG. 1), and the exhaust pipes 61 on the downstream sides of each vacuum pump 62 merge and are connected to, for example, a factory exhaust system.

The valve mechanism 7 opens and closes the flow path of the processing gas formed in each exhaust pipe 61, and has, for example, a casing 71 and an opening/closing portion 72. A first opening 73 connected to the exhaust pipe 61 on the upstream side is formed in the top surface of the casing 71, and a second opening 74 connected to the exhaust pipe 61 on the downstream side is formed in the side surface of the casing 71.

The opening/closing portion 72 has, for example, an opening/closing valve 721 formed to have a size that closes the first opening 73, and a lifting mechanism 722 provided outside the casing 71 so as to raise and lower the opening/closing valve 721 inside the casing 71. The opening/closing valve 721 is configured to be capable of being raised and lowered between a closing position for closing the first opening 73 indicated by the one-dot chain line in FIG. 4 and an opening position retracted downwards from the first and second openings 73 and 74 indicated by the solid line in FIG. 4. When the opening/closing valve 721 is located at the closing position, the downstream end of the confluent exhaust port 205 is closed, and the exhaust in the processing container 20 is stopped. In addition, when the opening/closing valve 721 is located at the opening position, the downstream end of the confluent exhaust port 205 is opened and the inside of the processing container 20 is exhausted.

Next, a processing gas supply system will be described with reference to FIG. 2 by taking the case in which two types of reaction gases are used as an example. A gas supply pipe 51 is connected to each gas supply part 4 at substantially the center of the top surface thereof. The gas supply pipe 51 is connected to a first reaction gas supply source 541 and a purge gas supply source 55 via a first common gas supply path 521 by a first gas supply pipe 511. In addition, the gas supply pipe 51 is connected to a second reaction gas supply source 542 and the purge gas supply source 55 via a second common gas supply path 522 by a second gas supply pipe 512. In FIG. 4, for convenience, the first common gas supply path 521 and the second common gas supply path 522 are collectively illustrated as a gas supply path 52. In addition, the first reaction gas supply source 541 and the second reaction gas supply source 542 are collectively illustrated as a reaction gas supply source 54. In addition, the first gas supply pipe 511 and the second gas supply pipe 512 are collectively illustrated as a gas supply pipe 510. A valve V2 and a flow control part M2 serve to supply a reaction gas, and the valve V3 and the flow control part M3 serve to supply a purge gas.

In addition, the gas supply pipe 51 is connected to a cleaning gas supply source 53 by a cleaning gas supply path 532 via a remote plasma unit (RPU) 531. The cleaning gas supply path 532 branches into four systems on the downstream side of the RPU 531 so as to be connected to each gas supply pipe 51. A valve V1 and a flow control part M1 are provided on the upstream side of the RPU 531 in the cleaning gas supply path 532. In addition, valves V11 to V14 are provided for respective branched pipes on the downstream side of the RPU 531, and the corresponding valves V11 to V14 are open during cleaning. For convenience, only valves V11 and V14 are illustrated in FIG. 4. Taking the case in which an insulating oxide film ($SiO_2$) is formed through CVD as an example, as the reaction gas, for example, tetraethoxysilane (TEOS) or oxygen ($O_2$) gas is used, and as the purge gas, for example, an inert gas such as nitrogen ($N_2$) gas is used. When TEOS and $O_2$ gas are used as the reaction gas, the TEOS is supplied from, for example, the first reaction gas supply source 541, and $O_2$ gas is supplied from the second reaction gas supply source 542. As the cleaning gas, for example, nitrogen trifluoride ($NF_3$) gas is used.

In view of the processing gas distributed from the common gas supply path 52, respective processing gas paths leading to the gas supply part 4 from respective gas supply pipes 51 are formed such that the conductances thereof are uniform with each other. For example, as illustrated in FIG. 2, the downstream side of the first common gas supply path 521 branches into two systems, and each gas supply path branch further branches into two systems such that first gas supply pipes 511 are formed in a tournament shape. On the downstream side of the valves V11 to V14 for cleaning gas, the first gas supply pipes 511 are connected to the gas supply pipes 51, respectively. In addition, the downstream side of the second common gas supply path 522 branches into two systems, and each gas supply path branch further branches into two systems such that second gas supply pipes 512 are formed in a tournament shape. On the downstream side of the valves V11 to V14 for cleaning gas, the second gas supply pipes 512 are connected to the gas supply pipes 51, respectively.

Each first gas supply pipe 511 is formed such that the length and inner diameter from the upstream end (the end connected to the first common gas supply paths 521) to the downstream end (the end connected to the gas supply part 4 or the gas supply pipe 51) are formed to be uniform for all of the first gas supply pipes 511. In addition, each second gas supply pipe 512 is formed such that the length and inner diameter from the upstream end (the end connected to the second common gas supply paths 522) to the downstream end are formed to be uniform for all of the second gas supply pipes 512. In this way, in view of the processing gas distributed from the first common gas supply path 521, respective gas processing paths leading to the confluent exhaust path 32 via the first gas supply pipes 511, the gas supply part 4, the processing spaces S1 to S4, and the exhaust paths 31 are formed such that conductances thereof are uniform with each other. In addition, in view of the processing gas distributed from the second common gas supply path 522, respective gas processing paths leading to the confluent exhaust path 32 via the second gas supply pipes 512, the gas supply part 4, the processing spaces S1 to S4, and the exhaust paths 31 are formed such that conductances thereof are uniform with each other.

The vacuum processing apparatus 2 is connected to the controller 8 of the vacuum processing system 1. The controller 8 controls each part of the vacuum processing apparatus 2. With the controller 8, an operator may perform a command input operation or the like using the input device in order to manage the vacuum processing apparatus 2. In addition, in the controller 8, the operating state of the vacuum processing apparatus 2 may be visualized and displayed by the display device. Furthermore, the storage of the controller 8 stores a control program and recipe data for controlling various processes, which are executed by the vacuum processing apparatus 2, by the processor. The processor of the controller 8 executes the control program and controls each part of the vacuum processing apparatus 2 according to the recipe data, whereby desired processing is executed in the vacuum processing apparatus 2. For example, the controller 8 controls each part of the vacuum processing apparatus 2 to execute substrate processing such as etching processing or film forming processing on a substrate carried into the vacuum processing apparatus 2.

[Configuration of Rotational Driving Mechanism and Adjustment Mechanism]

Figure 5:
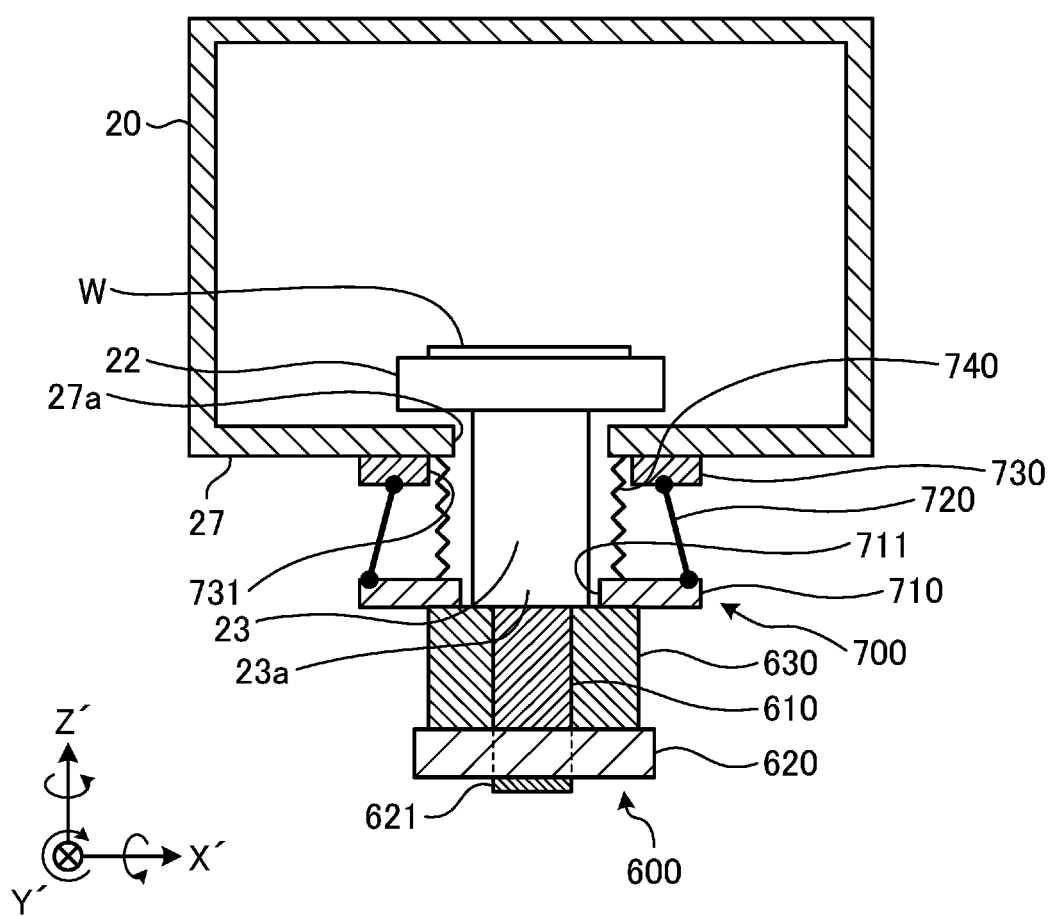
FIG. 5 is a view illustrating an exemplary configuration of a rotational driving mechanism and an adjustment mechanism according to an embodiment.

FIG. 5 is a view illustrating an exemplary configuration of a rotational driving mechanism 600 and an adjustment mechanism 700 according to an embodiment. A hole 27a is formed in the bottom 27 of the processing container 20 at a position corresponding to a position for supporting the stage 22. A support member 23 is inserted into the hole 27a to support the stage 22 from the bottom side. The rotational driving mechanism 600 is connected to the lower end portion 23a of the support member 23 located outside the processing container 20.

The rotational driving mechanism 600 has a rotation shaft 610, a motor 620, and a vacuum seal 630.

The rotation shaft 610 is connected to the lower end portion 23a of the support member 23, and is configured to be integrally rotatable with the support member 23. A slip ring 621 is provided at the lower end of the rotation shaft 610. The slip ring 621 has an electrode, and is electrically connected to various wiring lines for supplying power to parts around the stage 22. For example, the slip ring 621 is electrically connected to a wiring line for supplying power to the heater 24 embedded in the stage 22. For example, when an electrostatic chuck configured to electrostatically attract a wafer W is provided on the stage 22, the slip ring 621 is electrically connected to a wiring line of a DC voltage applied to the electrostatic chuck.

The motor 620 is connected to the rotation shaft 610, and rotates the rotation shaft 610. When the rotation shaft 610 rotates, the stage 22 rotates via the support member 23. When the rotation shaft 610 rotates, the slip ring 621 also rotates together with the rotation shaft 610, but the electrical connection between the slip ring 621 and various wiring lines for supplying power to the parts around the stage 22 is maintained.

The vacuum seal 630 is, for example, a magnetic fluid seal, and is provided around the rotation shaft 610 so as to allow rotation of the rotation shaft 610 be maintained while airtightly sealing the rotation shaft 610.

In addition, the adjustment mechanism 700 is engaged with the lower end portion 23a of the support member 23 via the vacuum seal 630.

The adjustment mechanism 700 includes a base member 710, a plurality of (e.g., six) actuators 720, an absorption mechanism 730, and a bellows 740.

The base member 710 is engaged with the lower end portion 23a of the support member 23 located outside the processing container 20 via the vacuum seal 630, and is configured to be integrally movable with the stage 22. For example, the base member 710 has therein a hole 711 formed to have a diameter larger than that of the lower end portion 23a of the support member 23. The support member 23 passes through the hole 711, and the lower end portion 23a is connected to the rotation shaft 610. The vacuum seal 630 is provided around the rotation shaft 610 connected to the lower end portion 23a of the support member 23, and the base member 710 is fixed to the top surface of the vacuum seal 630. As a result, the base member 710 is connected to the stage 22 via the vacuum seal 630, the rotation shaft 610, the support member 23, and the like, and is movable integrally with the stage 22.

The plurality of actuators 720 are provided in parallel with each other between the bottom 27 of the processing container 20 and the base member 710, and relatively move the base member 710 with respect to the bottom 27 of the processing container 20 to adjust the position and inclination of the stage 22. The actuators 720 are expandable and contractible, are rotatably and slidably connected to the base member 710 via universal joints, respectively, and are rotatably and slidably connected to the bottom 27 side of the processing container 20 via universal joints, respectively. The actuators 720 and the base member 710 form parallel link mechanisms, each of which is movable in the directions of the X', Y', and Z' axes illustrated in FIG. 5, the rotation direction around the X' axis, the rotation direction around the Y' axis, and the rotation direction around the Z' axis. A moving coordinate system of the parallel link mechanism formed by the plurality of actuators 720 and the base member 710 is adjusted in advance so as to match the coordinate system of the processing container 20. By connecting the bottom 27 of the processing container and the base member 710 via the parallel link mechanism, the plurality of actuators 720 are capable of moving the base member 710 relative to the bottom 27 of the processing container 20. Thereby, it is possible to adjust the position and inclination of the stage 22. For example, the plurality of actuators 720 adjust the position of the stage 22 by moving the base member 710 in a direction orthogonal to the outer wall surface of the bottom 27 of the processing container 20 (e.g., the Z' axis direction in FIG. 5). In addition, for example, the plurality of actuators 720 adjust the position of the stage 22 by moving the base member 710 in a direction following the outer wall surface of the bottom 27 of the processing container 20 (e.g., the X' axis direction and the Y' axis direction in FIG. 5). Furthermore, for example, the plurality of actuators 720 adjust the inclination of the stage 22 by tilting the base member 710 in a predetermined direction (e.g., the rotation direction around the X' axis and the rotation direction around the Y' axis in FIG. 5) relative to the outer wall surface of the bottom 27 of the processing container 20.

It is possible to specify the position and inclination of the stage 22 adjusted by the plurality of actuators 720 by detecting the position and inclination of the base member 710 using various detectors. Examples of the detectors may include a linear encoder, a gyro sensor, a 3-axis acceleration sensor, a laser tracker, and the like.

In the vacuum processing apparatus 2, when the pressure inside the processing container 20 is switched from the atmospheric state to the vacuum state, the processing container 20 is deformed due to the pressure difference. In addition, the temperature of the processing container 20 is changed due to the heat transferred thereto during the substrate processing carried out in the processing container 20, and the processing container 20 is also deformed by the temperature change. When the processing container 20 is deformed, stress due to the deformation of the processing container 20 is transmitted to the stage 22, and the position or inclination of the stage 22 may change.

Therefore, in the vacuum processing apparatus 2 according to the present embodiment, the plurality of actuators 720 are provided between the bottom 27 of the processing container 20 and the base member 710, which is integrally movable with the stage 22. The plurality of actuators 720 adjust the position or inclination of the stage 22 by relatively moving the base member 710 relative to the bottom 27. As a result, even when the position or inclination of the stage 22 changes due to the deformation of the processing container 20, it is possible to adjust the position and inclination of the stage 22 to the original position and inclination. As a result, the vacuum processing apparatus 2 according to the present embodiment is capable of reducing or eliminating deviation in the position and inclination of the stage 22 due to the deformation of the processing container 20. As a result, it is possible to improve in-plane uniformity in substrate processing such as film-forming processing.

The absorption mechanism 730 is provided on the bottom 27 of the processing container 20, and absorbs the deformation of the bottom of the processing container 20. A hole 731 is formed in the absorption mechanism 730 to communicate with the inside of the processing container 20 through the hole 27a in the bottom 27 of the processing container 20. The plurality of actuators 720 are connected to the absorption mechanism 730, rather than being directly connected to the bottom 27 of the processing container 20. As a result, even when the bottom 27 of the processing container 20 is deformed, stress due to the deformation of the bottom 27 of the processing container 20 is absorbed by the absorption mechanism 730 and is not transmitted to the plurality of actuators 720. Thus, it is possible to suppress degradation in the adjustment accuracy of the position or inclination of the stage 22. Details of the absorption mechanism 730 will be described later.

The bellows 740 is provided so as to surround the support member 23. The upper end of the bellows 740 is connected to the bottom 27 of the processing container 20 through the hole 731 formed in the absorption mechanism 730, and the lower end is connected to the base member. As a result, the bellows 740 airtightly seals the space between the bottom 27 of the processing container 20 and the base member 710. The bellows 740 is configured to be expandable and contractible according to the movement of the base member 710. For example, when the base member 710 moves in a direction orthogonal to the outer wall surface of the bottom 27 of the processing container 20 (e.g., the Z' axis direction in FIG. 5), the bellows 740 expands and contracts in the Z' axis direction. Further, for example, when the base member 710 moves in the direction following the outer wall surface of the bottom 27 of the processing container 20 (e.g., the X' axis direction and the Y' axis direction in FIG. 5), the bellows 740 expands and contracts in the X' axis direction and the Y' axis direction. Further, for example, when the base member 710 moves in a predetermined direction relative to the outer wall surface of the bottom 27 of the processing container 20 (e.g., the rotation direction around the X' axis and the rotation direction around the Y' axis in FIG. 5), the bellows 740 expands and contracts in the rotation direction around the X' axis and the rotation direction around the Y' axis. In the vacuum processing apparatus 2, since the bellows 740 expands and contracts even when the base member 710 is moved, air is not introduced into the processing container 20 through the space between the bottom 27 of the processing container 20 and the base member 710, the hole 731, and the hole 27a.

Figure 6:
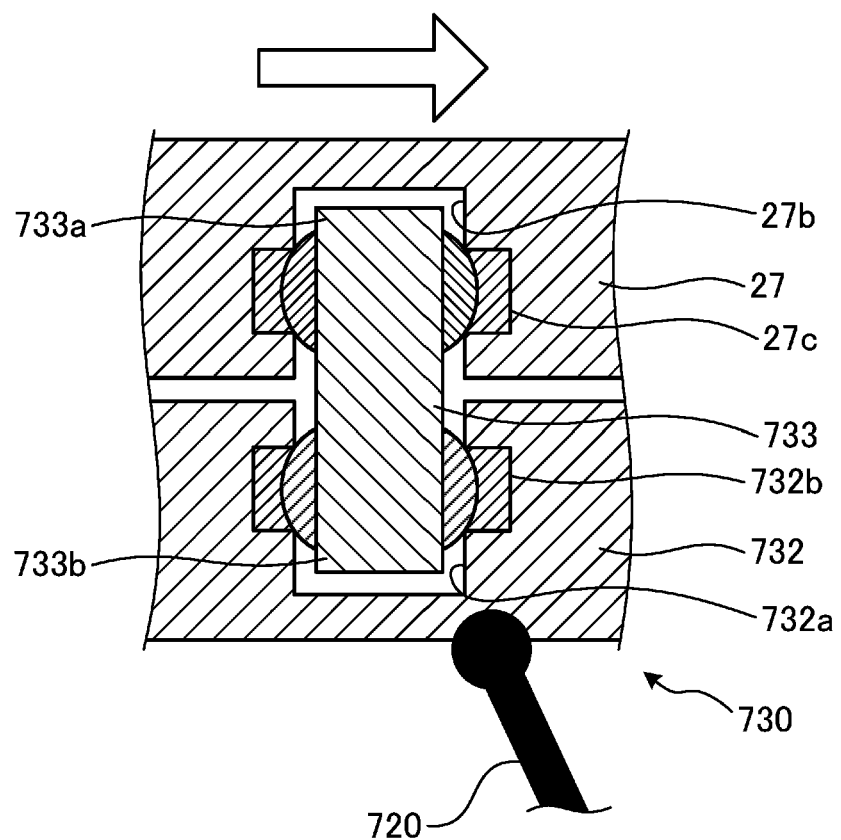
FIG. 6 is a view illustrating an exemplary configuration of the absorption mechanism illustrated in FIG. 5.

Here, an exemplary configuration of the absorption mechanism 730 will be described with reference to FIG. 6. FIG. 6 is a view illustrating an exemplary configuration of the absorption mechanism 730 illustrated in FIG. 5. The absorption mechanism 730 includes a plate member 732 and a rod member 733.

The plate member 732 is formed in a disk shape and arranged below the bottom 27 of the processing container 20. The plate member 732 is arranged at a distance from the outer wall surface of the bottom 27 of the processing container 20 from the viewpoint of blocking the transfer of heat and vibrations from the processing container 20.

One end of the rod member 733 is rotatably and slidably connected to the bottom 27 of the processing container 20, and the other end is rotatably and slidably connected to the plate member 732. That is, a recess 27b is formed in the outer wall surface of the bottom 27 of the processing container 20, and a spherical bearing 27c, which is freely rotatable and slidable, is installed in the recess 27b. One end 733a of the rod member 733 is rotatably and slidably connected to the bottom 27 of the processing container 20 by being connected to the spherical bearing 27c. Meanwhile, a recess 732a is formed in the top surface of the plate member 732 at a position corresponding to the recess 27b, and a spherical bearing 732b, which is freely rotatable and slidable, is installed in the recess 732a. The other end 733b of the rod member 733 is rotatably and slidably connected to the plate member 732 by being connected to the spherical bearing 732b. The rod member 733 rotates in a direction corresponding to the deformation of the bottom 27 of the processing container 20, thereby suppressing the transfer of the deformation to the plate member 732. For example, when the bottom 27 of the processing container 20 is deformed in the direction indicated by the arrow in FIG. 6, the rod member 733 is stressed by the deformation of the bottom 27 but is rotated together with the bottom 27 in the direction indicated by the arrow in FIG. 6, thereby suppressing the transfer of the deformation to the plate member 732. The plurality of actuators 720 is connected to the plate member 732. As a result, since the stress due to the deformation of the bottom 27 of the processing container 20 is not transmitted to the plurality of actuators 720 via the plate member 732, it is possible to suppress the degradation in the adjustment accuracy of the position or inclination of the stage 22.

In addition, rod members 733 are arranged at a plurality of positions in the circumferential direction of the plate member 732. For example, three rod members 733 are provided at a plurality of positions inside the edge along the circumferential direction of the plate member 732 at equal intervals. Four or more rod members 733 may be provided at equal intervals along the circumferential direction of the plate member 732.

Specific Example of Flow of Method of Controlling Vacuum Processing Apparatus

Figure 7:
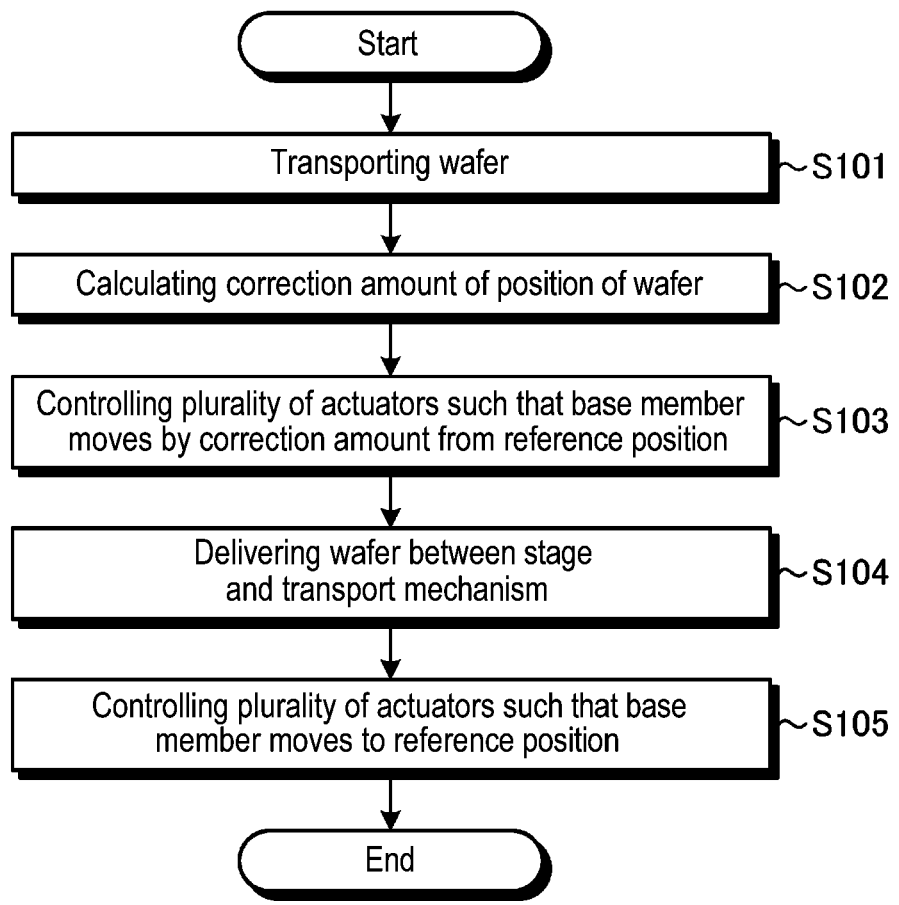
FIG. 7 is a flowchart illustrating Example 1 of the flow of a method of controlling a vacuum processing apparatus according to an embodiment.

Next, a specific example of a flow of a method of controlling the vacuum processing apparatus 2 according to an embodiment will be described. FIG. 7 is a flowchart illustrating Example 1 of the flow of a method of controlling the vacuum processing apparatus 2 according to an embodiment.

The controller 8 controls the substrate transport mechanism 15 to transport a wafer W toward the vacuum processing apparatus 2 (step S101).

The controller 8 calculates the deviation amount when the wafer W is transported by the substrate transport mechanism 15 as the correction amount of the position of the wafer W (step S102). The correction amount of the position of the wafer W is calculated by detecting, for example, the deviation amount between the wafer W and the target position of the transport by the substrate transport mechanism 15 using a position detection sensor provided at an arbitrary position on the transport path of the wafer W. The position detection sensor is provided, for example, in the vacuum transport chamber 14 in which the substrate transport mechanism 15 is arranged. In addition, the position detection sensor may be provided in the carry-in/out port 21 of the vacuum processing apparatus 2. The target position is a wafer W placement position on the stage 22, for example, a position at which the center of the stage 22 and the center of the wafer W coincide with each other.

The controller 8 controls the plurality of actuators 720 such that the base member 710 moves from a predetermined reference position by the correction amount calculated in step S102 (step S103). The reference position is, for example, a position at which the center of the stage 22 and the center of the processing container 20 coincide with each other. As the base member 710 moves, the stage 22 also moves from the reference position by the correction amount.

When the substrate transport mechanism 15 reaches the vacuum processing apparatus 2, the controller 8 controls the substrate transport mechanism 15 to transport a wafer W to a position above the target position in the processing container 20. Then, the controller 8 causes the wafer W to be delivered between the stage 22 and the substrate transport mechanism 15 (step S104). In this step, the center of the stage 22 and the center of the wafer W coincide with each other. It is possible to implement the delivery of the wafer W in step S104 using the method of FIG. 8, to be described later.

The controller 8 controls a plurality of actuators 720 such that the base member 710 moves to the reference position (step S105). When the base member 710 moves, the stage 22 also moves to the reference position. At this step, the center of the stage 22, the center of the wafer W, and the center of the processing container 20 coincide with each other.

In this way, in the vacuum processing apparatus 2, instead of moving the substrate transport mechanism 15 by the correction amount, the base member 710 and the stage 22 are integrally moved by the correction amount to deliver the wafer W. Therefore, it is possible to reduce the transport load of the substrate transport mechanism 15. As a result, it is possible to improve the throughput of the entire vacuum processing system 1.

In FIG. 7, the processes of steps S103 to S105 are executed in parallel for each of the four processing spaces S1 to S4 in the processing container 20. As a result, when the substrate transport mechanism 15 collectively transports four wafers W to the four processing spaces S1 to S4 in the processing container 20, it is possible to realize a collective delivery of the wafers W between the stage 22 and the substrate transport mechanism 15 (step S104). As a result, it is possible to further improve the throughput of the entire vacuum processing system 1.

Figure 8:
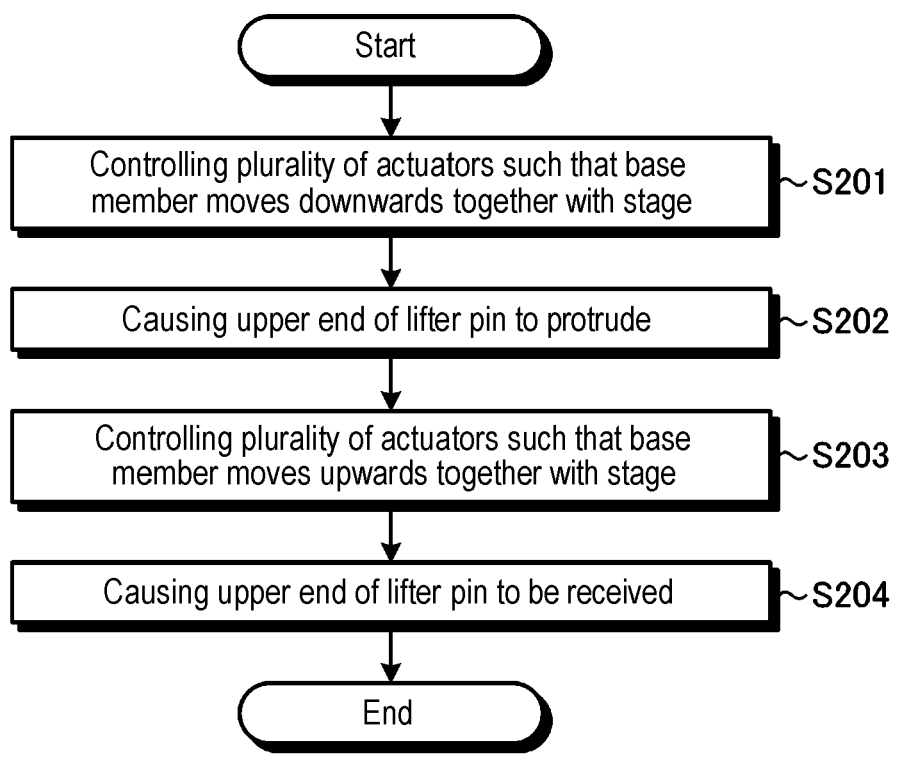
FIG. 8 is a flowchart illustrating Example 2 of the flow of a method of controlling a vacuum processing apparatus according to an embodiment.

FIG. 8 is a flowchart illustrating Example 2 of the flow of a method of controlling the vacuum processing apparatus 2 according to an embodiment. The control method illustrated in FIG. 8 is applied to, for example, the delivery of a wafer W in step S104 of FIG. 7. In the initial stage, it is assumed that the stage 22 is located at the processing position.

The controller 8 controls the plurality of actuators 720 such that the base member 710 moves downwards together with the stage 22 (that is, the negative direction of the Z' axis in FIG. 5) (step S201). As a result, the stage 22 starts to be lowered.

The controller 8 causes the lower ends of the lifter pins 26 to come into contact with the bottom 27 of the processing container 20 as the stage 22 moves downwards, whereby the upper ends of the lifter pins 26 protrude from the placement surface of the stage 22 (Step S202). In this step, the stage 22 is in the state of being lowered from the processing position to the delivery position.

The controller 8 controls the plurality of actuators 720 such that the base member 710 moves upwards together with the stage 22 (that is, the positive direction of the Z' axis in FIG. 5) (step S203). As a result, the stage 22 starts to be raised.

The controller 8 causes the lower ends of the lifter pins 26 to be separated from the bottom 27 of the processing container 20 when the stage 22 moves upwards, whereby the upper ends of the lifter pins 26 are received at the placement surface sides of the pin through holes 26*a* (step S204). In this step, the stage 22 is in the state of being raised to the processing position.

In this way, in the vacuum processing stage 2, it is possible to cause the lifter pin 26 to protrude and retract by raising and lowering the base member 710. Therefore, it is possible to omit a lifter pin driving mechanism for driving the lifter pins 26, and it is possible to reduce the number of components in the processing container 20. Here, in the processing container 20, substrate processing may be performed on a wafer W by generating plasma. In this case, the components in the processing container 20 are consumed by plasma, and the particles generated from the consumed components may deteriorate processing characteristics of the wafer W. In contrast, in the vacuum processing apparatus 2, it is possible to reduce the number of components in the processing container 20 by omitting the lifter pin driving mechanism. Thus, it is possible to reduce the risk of particle generation. In addition, it is possible to raise and lower the stage 22 using the adjustment mechanism 700, without providing a separate mechanism for raising and lowering the stage 22.

Figure 9:
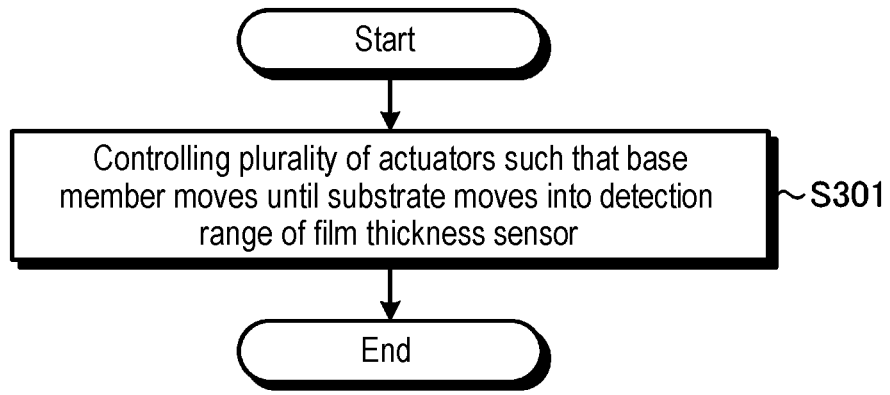
FIG. 9 is a flowchart illustrating Example 3 of the flow of a method of controlling a vacuum processing apparatus according to an embodiment.

FIG. 9 is a flowchart illustrating Example 3 of the flow of a method of controlling the vacuum processing apparatus 2 according to an embodiment. In the following description, it is assumed that a film thickness sensor is arranged around the shower plate 43. The film thickness sensor is configured to be able to detect the film thickness on a wafer W located within a predetermined detection range in a non-contact manner.

The controller 8 controls the plurality of actuators 720 such that the base member 710 moves until the wafer W placed on the stage 22 moves into the detection range of the film thickness sensor (step S301). For example, the controller 8 controls the plurality of actuators 720 to tilt the base member 710 until the wafer W placed on the stage 22 moves into the detection range of the film thickness sensor.

In this way, in the vacuum processing apparatus 2, it is possible to move the wafer W placed on the stage 22 into the detection range of the film thickness sensor. As a result, the vacuum processing apparatus 2 is capable of detecting the film thickness in real time during the execution of substrate processing even when the film thickness sensor is arranged around the shower plate 43 facing the stage 22.

Figure 10:
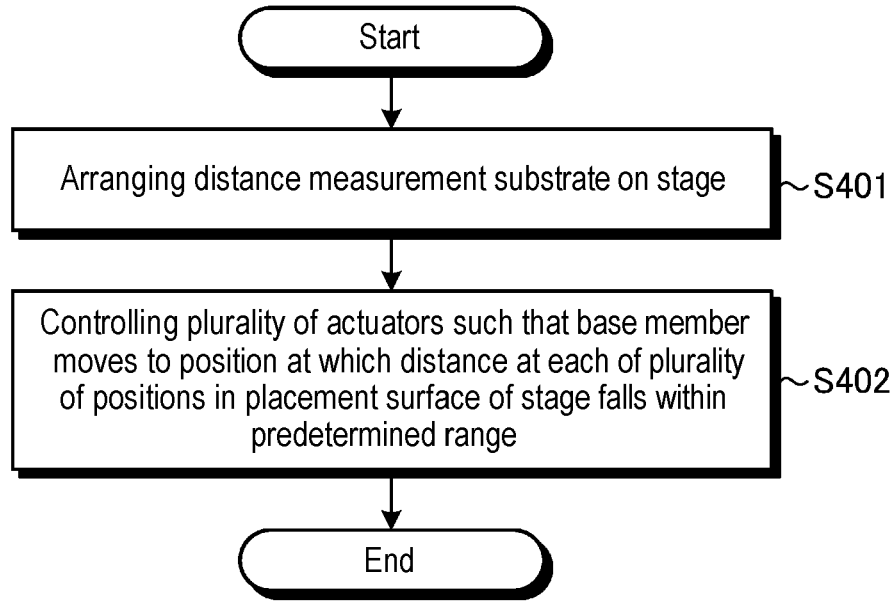
FIG. 10 is a flowchart illustrating Example 4 of the flow of a method of controlling a vacuum processing apparatus according to an embodiment.

FIG. 10 is a flowchart illustrating Example 4 of the flow of a method of controlling the vacuum processing apparatus 2 according to an embodiment. In the control method illustrated in FIG. 10, a distance measurement substrate capable of measuring the distance between the stage 22 and the shower plate 43 (hereinafter, appropriately referred to as a "gap") is used at each of a plurality of positions on the placement surface of the stage 22. The distance measurement substrate has a wireless communication function of transmitting a gap measured for each of the plurality of positions in the placement surface of the stage 22 to the controller 8 as a measurement result.

The controller 8 arranges the distance measurement substrate on the stage 22 (step S401). The controller 8 instructs the distance measurement substrate to measure the gap. The distance measurement substrate informs the controller 8 of a gap measured at each of the plurality of positions in the circumferential direction of the stage 22 as a measurement result.

Based on the result of measurement by the distance measurement substrate, the controller 8 controls the plurality of actuators 720 such that the base member 710 moves to a position at which distances (i.e., gaps) at a plurality of positions in the placement surface of the stage 22 fall within a predetermined range (step S402).

As described above, in the vacuum processing apparatus 2, it is possible to make the gaps uniform at a plurality of positions in the placement surface of the stage 22 without opening the processing container 20. As a result, the vacuum processing apparatus 2 is capable of improving the in-plane uniformity of substrate processing on the wafer W while maintaining the vacuum state of the processing container 20.

Figure 11:
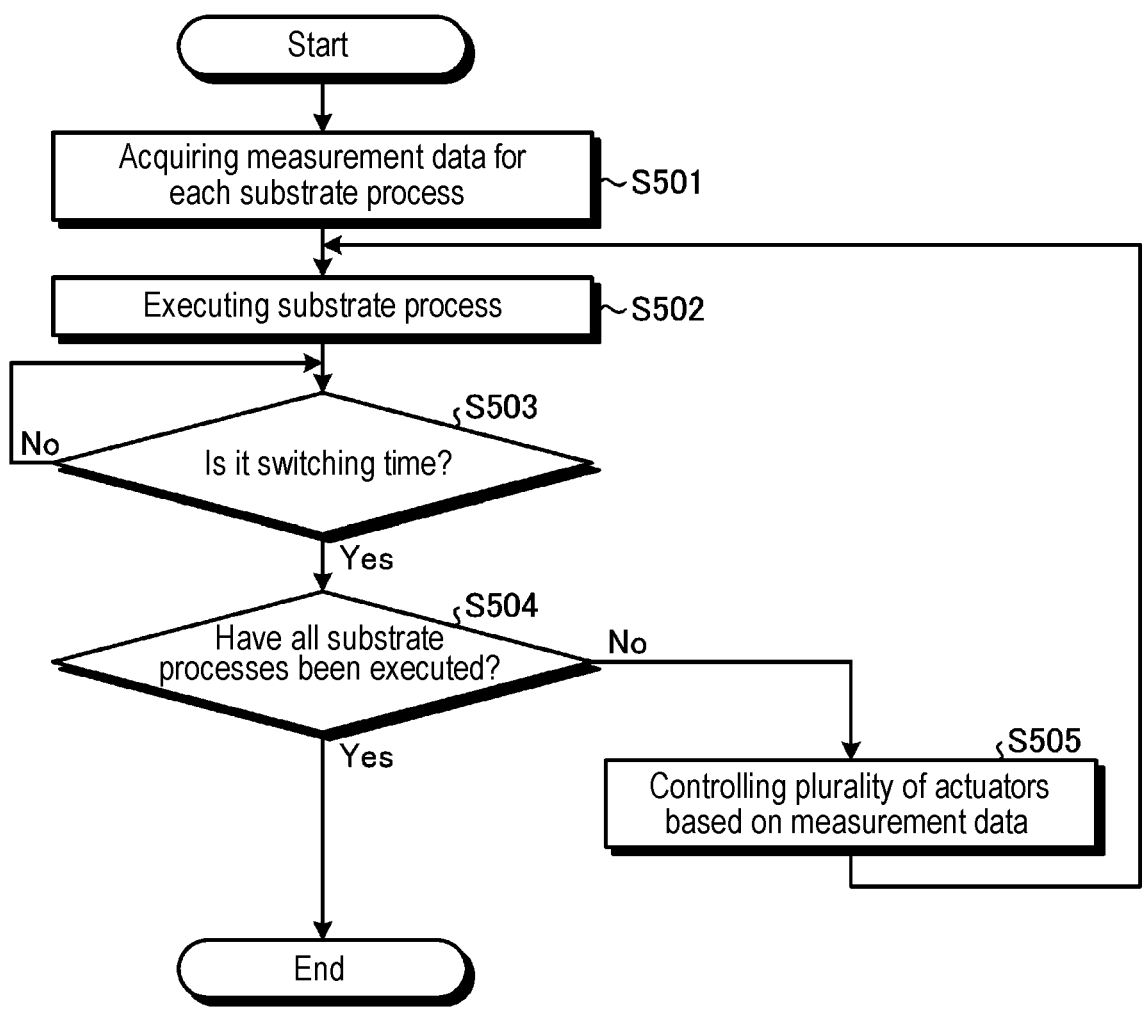
FIG. 11 is a flowchart illustrating Example 5 of the flow of a method of controlling a vacuum processing apparatus according to an embodiment.

FIG. 11 is a flowchart illustrating Example 5 of the flow of a method of controlling the vacuum processing apparatus 2 according to an embodiment.

The controller 8 acquires measurement data indicating the position and the inclination of the stage 22 relative to the state of the wafer W that satisfy a predetermined condition and are measured for each substrate process executed in the processing container 20 (step S501). For example, the controller 8 reads measurement data from the storage of the controller 8 and acquires the measurement data. The state of the wafer W is, for example, a numerical value representing the quality of a film formed on the wafer W through substrate processing. When the measurement data is stored in another device, the controller 8 may acquire the measurement data from the other device via a network. In addition, the controller 8 may generate and acquire measurement data through machine learning based on the position and inclination of the stage 22 relative to the state of the wafer W for each substrate process.

The controller 8 executes the substrate processing in the processing container 20 (step S502).

The controller 8 determines whether the time for switching the substrate processing being executed has arrived (step S503). When the time of switching has not arrived yet (step S503: No), the controller 8 continues the substrate processing currently being executed.

Meanwhile, when the switching time has arrived (step S503: Yes), the controller 8 determines whether the execution of all the substrate processing has been completed (step S404). When the execution of all substrate processing has not been completed (step S504: No), the controller 8 controls the plurality of actuators 720 based on the measurement data acquired in step S501 (step S505). That is, the controller 8 refers to the measurement data and obtains the position and inclination of the stage 22 corresponding to the next substrate process to be performed at a switching destination. Then, the controller 8 controls the plurality of actuators 720 to move the base member 710 such that the position and inclination of the stage 22 become the obtained position and inclination. After moving the base member 710, the controller 8 returns the processing to step S502, and executes the next substrate process at the switching destination in the processing container 20.

Meanwhile, when execution of all of the substrate processing is completed (step S504: Yes), the controller 8 terminates the processing.

In this way, the vacuum processing apparatus 2 is capable of dynamically adjusting the position and inclination of the stage 22 for each substrate process. As a result, the vacuum processing apparatus 2 is capable of obtaining an optimum processing result for each substrate process when the substrate processing is continuously and sequentially executed.

Effect of Embodiment

As described above, the vacuum processing apparatus 2 according to the embodiment includes a processing container 20, a stage 22, a support member 23, a base member 710, and a plurality of actuators 720. The processing container 20 is configured to be capable of maintaining the inside thereof in a vacuum atmosphere. The stage 22 is provided in the processing container 20 such that a wafer W (substrate) is placed thereon. The support member 23 penetrates the hole in the bottom 27 of the processing container 20 and supports the stage 22 from the bottom side thereof. The base member 710 is configured to be integrally movable with the stage 22 by being engaged with the end portion of the support member 23 located outside the processing container 20. The plurality of actuators 720 are provided parallel each other between the bottom 27 of the processing container 20 and the base member 710, and move the base member 710 relative to the bottom 27 of the processing container 20 to adjust the position and inclination of the stage 22. As a result, the vacuum processing apparatus 2 is capable of reducing or eliminating deviation in the position and inclination of the stage 22 due to the deformation of the processing container 20.

In addition, the plurality of actuators 720 and the base member 710 form parallel link mechanisms, each of which is capable of moving the base member 710 in the directions of a plurality of axes and the rotation directions around respective axes. The plurality of actuators 720 and the base member 710 connect the bottom 27 of the processing container 20 and the base member 710 via the parallel link mechanisms. As a result, the vacuum processing apparatus 2 is capable of reducing or eliminating deviation in the position and inclination of the stage 22 by moving the base member 710 relative to the bottom 27 of the processing container 20 using the operation of the parallel link mechanisms.

In addition, the plurality of actuators 720 adjust the position of the stage 22 by moving the base member 710 in a direction orthogonal to the outer wall surface of the bottom 27 of the processing container 20. As a result, the vacuum processing apparatus 2 is capable of reducing or eliminating deviation in the position of the stage 22 in a direction orthogonal to the outer wall surface of the bottom 27 of the processing container 20.

In addition, the plurality of actuators 720 adjust the position of the stage 22 by moving the base member 710 in a direction following the outer wall surface of the bottom 27 of the processing container 20. As a result, the vacuum processing apparatus 2 is capable of reducing or eliminating deviation in the position of the stage 22 in a direction following the outer wall surface of the bottom 27 of the processing container 20.

In addition, the plurality of actuators 720 adjust the inclination of the stage 22 by tilting the base member 710 relative to the outer wall surface of the bottom 27 of the processing container 20. As a result, the vacuum processing apparatus 2 is capable of reducing or eliminating deviation in the inclination of the stage 22 relative to the bottom 27 of the processing container 20.

In addition, the vacuum processing apparatus 2 further includes an expandable and contractible bellows 740 (an expandable and contractible member) provided around the support member 23 to airtightly seal the space between the bottom 27 of the processing container 20 and the base member 710 and to be expandable and contractible according to the movement of the base member 710. As a result, the vacuum processing apparatus 2 is capable of preventing the inflow of air into the processing container 20 even when the base member 710 is moved.

Further, the vacuum processing apparatus 2 further includes an absorption mechanism 730 configured to absorb the deformation of the bottom 27 of the processing container 20. The plurality of actuators are connected to the absorption mechanism 730. As a result, stress due to the deformation of the bottom 27 of the processing container 20 is absorbed by the absorption mechanism 730 and is not transmitted to the plurality of actuators 720. Thus, the vacuum processing apparatus 2 is capable of suppressing degradation in the accuracy of adjustment of the position and inclination of the stage 22.

In addition, the absorption mechanism 730 includes a plate member 732 and a rod member 733. One end of the rod member 733 is rotatably and slidably connected to the bottom 27 of the processing container 20, and the other end is rotatably and slidably connected to the plate member 732. The rod member 733 rotates in a direction corresponding to the deformation of the bottom 27 of the processing container 20, thereby suppressing the transfer of deformation to the plate member 732. The plurality of actuators 720 are connected to the plate member 732. As a result, stress due to the deformation of the bottom 27 of the processing container 20 is absorbed by the plate member 732 and is not transmitted to the plurality of actuators 720. Thus, the vacuum processing apparatus 2 is capable of suppressing degradation in the accuracy of adjustment of the position and inclination of the stage 22.

In addition, the plate member 732 is arranged at a distance from the outer wall surface of the bottom 27 of the processing container 20. As a result, the vacuum processing apparatus 2 is capable of blocking the transfer of heat and vibrations from the processing container 20 to the plate member 732.

In addition, a method of controlling the vacuum processing apparatus 2 according to the embodiment includes a step of calculating a deviation amount when a wafer W (a substrate) is transported by the substrate transport mechanism 15 (a transport mechanism) as a correction amount of the position of the wafer W, a step of controlling a plurality of actuators 720 such that the base member 710 moves from a predetermined reference position by the correction amount, a step of delivering the wafer W between the stage 22 moved together with the base member 710 and the substrate transport mechanism 15, and a step of controlling the plurality of actuators 720 such that the base member 710 moves to a reference position after the wafer W is delivered. As a result, the vacuum processing apparatus 2 is capable of improving the throughput of the entire vacuum processing system 1.

In addition, pin through holes 26a are formed in the stage 22 to penetrate the placement surface of the stage 22 and the rear surface with respect to the placement surface. The vacuum processing apparatus 2 further includes lifter pins 26 slidably inserted into respective pin through holes 26a such that the upper end of each of the lifter pins is suspended from the placement surface side of the stage 22 of the corresponding one of the pin through holes 26a and the lower end thereof protrudes from the rear surface of the stage 22 to the side of the bottom 27 of the processing container 20. A method of controlling the vacuum processing apparatus 2 according to the embodiment may include a step of controlling the plurality of actuators 720 such that the base member 710 moves downwards together with the stage 22, a step of causing the upper end of each of the lifter pins 26 to protrude from the placement surface of the stage 22 by causing the lower end of each of the lifter pins 26 to come into contact with the bottom 27 of the processing container 20 as the stage 22 moves downwards, a step of controlling the plurality of actuators such that the base member 710 moves upwards together with the stage 22, and a step of separating the lower end of each of the lifter pins 26 from the bottom 27 of the processing container 20 when the stage 22 moves upwards so as to cause the upper ends of the lifter pins 26 to be received in respective pin through holes 26a at the placement surface side of the stage 22. As a result, in the vacuum processing apparatus 2, it is possible to reduce the number of components in the processing container 20 by omitting the lifter pin driving mechanism. Thus, it is possible to reduce the risk of particle generation.

In addition, the vacuum processing apparatus 2 further includes a shower plate 43 (an upper electrode) arranged in the processing container 20 to face the above-mentioned stage 22 in the processing container 20, and a film thickness sensor arranged around the shower plate 43 to be capable of detecting the film thickness of a wafer W located within a predetermined detection range in a non-contact manner. A method of controlling the vacuum processing apparatus 2 according to an embodiment may include a step of controlling the plurality of actuators 720 such that the base member 710 moves until the wafer W mounted on the stage 22 moves into the detection range of the film thickness sensor. As a result, the vacuum processing apparatus 2 is capable of detecting the film thickness in real time during the execution of substrate processing even when the film thickness sensor is arranged around the shower plate 43 facing the stage 22.

In addition, a method of controlling the vacuum processing apparatus 2 according to an embodiment includes a step of arranging a distance measurement substrate capable of measuring the distance between the stage 22 and the shower plate 43 (an upper electrode) at each of a plurality of positions in the placement surface of the stage 22 and a step of controlling the plurality of actuators 720 such that the base member 710 moves to a position at which the distances at the plurality of positions in the placement surface of the stage 22 fall within a predetermined range based on the result of measurement by the distance measurement substrate. As a result, the vacuum processing apparatus 2 is capable of improving the in-plane uniformity of substrate processing on the wafer W while maintaining the vacuum state in the processing container 20.

In addition, a method of controlling the vacuum processing apparatus 2 according to an embodiment includes a step of acquiring measurement data indicating the position and inclination of the stage 22 with respect to the state of a wafer W (a substrate) satisfying a predetermined condition measured for each substrate process executed in the processing container 20, a step of sequentially executing the substrate processing in the processing container 20, and a step of controlling the plurality of actuators 720 based on the measurement data whenever the time for switching the substrate processing arrives. As a result, the vacuum processing apparatus 2 is capable of obtaining an optimum processing result for each substrate process when the substrate processing is continuously and sequentially executed.

Although embodiments have been described above, it should be considered that the embodiments disclosed herein are illustrative and are not restrictive in all respects. In addition, the embodiments described above may be omitted, replaced, or modified in various forms without departing from the scope and spirit of the claims.

For example, in the embodiments described above, an example in which the vacuum processing apparatus 2 is an apparatus that performs plasma CVD processing as substrate processing has been described, but the technique disclosed herein may be applied to any apparatus that performs other substrate processing, such as plasma etching.

In addition, in the embodiments described above, an example in which the plurality of actuators 720 are rotatably and slidably connected to the base member 710 via respective universal joints and are rotatably and slidably connected to the bottom 27 side of the processing container 20 (i.e., the absorption mechanism 730 in FIG. 5) via respective universal joints has been described as an example. However, the technique disclosed herein is not limited thereto. The absorption mechanism 730 may be omitted, and one end of each of the actuators 720 may be rotatably and slidably connected to the bottom 27 of the processing container 20 via a universal joint. In addition, the base member 710 may be omitted, and the other end of the actuator 720 may be rotatably and slidably connected to a portion of the vacuum seal 630 via a universal joint. In this case, the vacuum seal 630 functions as a base member.

According to the present disclosure, it is possible to reduce or eliminate deviation in the position and inclination of a stage due to the deformation of a processing container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A vacuum processing apparatus comprising:
a processing container configured to be capable of maintaining an inside of the processing container in a vacuum atmosphere;
a stage provided in the processing container and having a substrate placed on the stage;
a support member passing through a hole in a bottom of the processing container to support the stage from a bottom side of the stage;
a base member engaged with the support member located outside the processing container to be movable integrally with the stage;
a plurality of actuators provided in parallel with each other between the bottom of the processing container and the base member, and configured to adjust a position and an inclination of the stage by moving the base member relative to the bottom of the processing container; and
an absorption mechanism configured to absorb deformation of the bottom of the processing container,
wherein the plurality of actuators are connected to the absorption mechanism.

2. The vacuum processing apparatus of claim 1, wherein the plurality of actuators and the base member form parallel link mechanisms, each of which is configured to be capable of moving the base member in directions of a plurality of axes and a rotation direction around each axis, and the bottom of the processing container and the base member are connected to each other by the parallel link mechanisms.

3. The vacuum processing apparatus of claim 2, wherein the plurality of actuators are configured to adjust the position of the stage by moving the base member in a direction orthogonal to an outer wall surface of the bottom of the processing container.

4. The vacuum processing apparatus of claim 3, wherein the plurality of actuators are configured to adjust the position of the stage by moving the base member in a direction following an outer wall surface of the bottom of the processing container.

5. The vacuum processing apparatus of claim 4, wherein the plurality of actuators are configured to adjust the inclination of the stage by tilting the base member relative to an outer wall surface of the bottom of the processing container.

6. The vacuum processing apparatus of claim 5, further comprising:
an expandable and contractible member provided around the support member to airtightly seal a space between the bottom of the processing container and the base member, and configured to be expandable and contractible according to movement of the base member.

7. The vacuum processing apparatus of claim 6, wherein the absorption mechanism comprises:
a plate member; and
a rod member having one end rotatably and slidably connected to the bottom of the processing container and the other end rotatably and slidably connected to the plate member, the rod member being configured to suppress transfer of the deformation of the bottom of the processing container to the plate member by being rotated in a direction corresponding to the deformation of the bottom of the processing container,
wherein the plurality of actuators are connected to the plate member.

8. The vacuum processing apparatus of claim 7, wherein the plate member is arranged at a distance from an outer surface of the bottom of the processing container.

9. The vacuum processing apparatus of claim 1, wherein the plurality of actuators are configured to adjust the position of the stage by moving the base member in a direction orthogonal to an outer wall surface of the bottom of the processing container.

10. The vacuum processing apparatus of claim 1, wherein the plurality of actuators are configured to adjust the position of the stage by moving the base member in a direction following an outer wall surface of the bottom of the processing container.

11. The vacuum processing apparatus of claim 1, wherein the plurality of actuators are configured to adjust the inclination of the stage by tilting the base member relative to an outer wall surface of the bottom of the processing container.

12. The vacuum processing apparatus of claim 1, further comprising:
an expandable and contractible member provided around the support member to airtightly seal a space between the bottom of the processing container and the base member, and configured to be expandable and contractible according to movement of the base member.

13. A method of controlling a vacuum processing apparatus that comprises a processing container configured to be capable of maintaining an inside of the processing container in a vacuum atmosphere, a stage provided in the processing container and having a substrate placed on the stage, a support member passing through a hole in a bottom of the processing container to support the stage from a bottom side of the stage, a base member configured to be engaged with the support member located outside the processing container and move integrally with the stage, a plurality of actuators provided in parallel with each other between the bottom of the processing container and the base member and configured to adjust a position and an inclination of the stage by moving the base member relative to the bottom of the processing container, and an absorption mechanism configured to absorb deformation of the bottom of the processing container, wherein the plurality of actuators are connected to the absorption mechanism,
wherein the method comprises:
calculating a deviation amount when the substrate is transported by a transport mechanism as a correction amount of a position of a substrate;
controlling the plurality of actuators such that the base member moves from a predetermined reference position by the correction amount;
delivering the substrate between the stage moved together with the base member and the transport mechanism; and
controlling the plurality of actuators such that the base member moves to the reference position after the substrate is delivered.

14. A method of operating a vacuum processing apparatus that comprises a processing container configured to be capable of maintaining an inside of the processing container in a vacuum atmosphere, a stage provided in the processing container and having a substrate placed on the stage, a support member passing through a hole in a bottom of the processing container to support the stage from a bottom side of the stage, a base member engaged with the support member located outside the processing container to be movable integrally with the stage, a plurality of actuators provided in parallel with each other between the bottom of the processing container and the base member and configured to adjust a position and an inclination of the stage by moving the base member relative to the bottom of the processing container, and an absorption mechanism configured to absorb deformation of the bottom of the processing container, wherein the plurality of actuators are connected to the absorption mechanism, wherein a through hole is formed in the stage to penetrate a placement surface of the stage and a rear surface with reference to the placement surface, and the vacuum processing apparatus further comprises a lifter pin slidably inserted into the through hole and having an upper end suspended from a placement surface side of the stage of the through hole and a lower end protruding from the rear surface of the stage to a bottom side of the processing container, and wherein the method comprises:

controlling the plurality of actuators such that the base member moves downwards together with the stage;

causing the upper end of the lifter pin to protrude from the placement surface of the stage by causing the lower end of the lifter pin to come into contact with a bottom side member of the processing container when the stage moves downwards;

controlling the plurality of actuators such that the base member moves upwards together with the stage; and causing the upper end of the lifter pin to be received in the through hole at a placement surface side of the stage by causing the lower end of the lifter pin to be separated from the bottom side of the processing container when the stage moves upwards.

* * * * *